(12) United States Patent
Yuferev et al.

(10) Patent No.: US 12,159,829 B2
(45) Date of Patent: Dec. 3, 2024

(54) SEMICONDUCTOR PACKAGE WITH NON-UNIFORMLY DISTRIBUTED VIAS

(71) Applicant: Infineon Technologies Austria AG, Villach (AT)

(72) Inventors: Sergey Yuferev, Villach (AT); Robert Fehler, Regensburg (DE); Petteri Palm, Stein (DE)

(73) Assignee: Infineon Technologies Austria AG, Villach (AT)

(*) Notice: Subject to any disclaimer, the term of this patent is extended or adjusted under 35 U.S.C. 154(b) by 122 days.

(21) Appl. No.: 17/877,177

(22) Filed: Jul. 29, 2022

(65) Prior Publication Data

US 2022/0367350 A1 Nov. 17, 2022

Related U.S. Application Data

(63) Continuation of application No. 16/560,139, filed on Sep. 4, 2019, now Pat. No. 11,444,017.

(30) Foreign Application Priority Data

Sep. 5, 2018 (EP) ..................................... 18192833

(51) Int. Cl.
*H01L 23/522* (2006.01)
*G06F 30/394* (2020.01)
*G06F 30/398* (2020.01)
*H01L 21/768* (2006.01)
(Continued)

(52) U.S. Cl.
CPC ........ *H01L 23/5226* (2013.01); *G06F 30/394* (2020.01); *G06F 30/398* (2020.01); *H01L 21/76802* (2013.01); *H01L 21/76877* (2013.01); *H01L 23/5283* (2013.01);
(Continued)

(58) Field of Classification Search
CPC ............. H01L 23/5226; H01L 23/5283; H01L 21/76802; H01L 21/76877; H01L 24/03; H01L 24/06; H01L 24/82; H01L 2224/06182; H01L 2224/04105; G06F 30/394; G06F 30/398
See application file for complete search history.

(56) References Cited

U.S. PATENT DOCUMENTS

| | | | |
|---|---|---|---|
| 6,689,634 B1 | 2/2004 | Lyne | |
| 9,615,456 B2 * | 4/2017 | Haba | ...................... H01L 24/17 |
| 9,859,229 B2 | 1/2018 | Tsai et al. | |

(Continued)

FOREIGN PATENT DOCUMENTS

| | | |
|---|---|---|
| CN | 108028234 A | 5/2018 |
| WO | 2007064073 A1 | 6/2007 |

*Primary Examiner* — Dao H Nguyen
(74) *Attorney, Agent, or Firm* — Murphy, Bilak & Homiller, PLLC

(57) ABSTRACT

In an embodiment, a semiconductor package includes a semiconductor device embedded in an insulating layer and having a first contact pad at a first surface of the semiconductor device. An outer contact pad is positioned on a lower surface of the insulating layer. A vertical redistribution structure electrically couples the first contact pad to the outer contact pad. The first contact pad has a plurality of first via sites. A first subset of the first via sites is occupied by first vias and a second subset of the first via sites remains unoccupied and forms a first via-free zone, such that the first vias are non-uniformly distributed over the first contact pad.

23 Claims, 10 Drawing Sheets

(51) Int. Cl.
*H01L 23/00* (2006.01)
*H01L 23/528* (2006.01)

(52) U.S. Cl.
CPC .............. *H01L 24/03* (2013.01); *H01L 24/06* (2013.01); *H01L 2224/06182* (2013.01)

(56) References Cited

U.S. PATENT DOCUMENTS

| | | | |
|---|---|---|---|
| 2004/0183192 A1* | 9/2004 | Otsuka | H01L 24/82 |
| | | | 257/734 |
| 2009/0057893 A1 | 3/2009 | Iwaki | |
| 2009/0115050 A1 | 5/2009 | Kasuya et al. | |
| 2012/0013003 A1 | 1/2012 | Rhyner et al. | |
| 2013/0049182 A1 | 2/2013 | Gong et al. | |
| 2016/0118337 A1 | 4/2016 | Yoon et al. | |
| 2017/0084589 A1 | 3/2017 | Kuo et al. | |
| 2017/0154831 A1 | 6/2017 | Standing | |
| 2018/0026019 A1* | 1/2018 | Tao | H01L 25/071 |
| | | | 257/668 |
| 2020/0006196 A1* | 1/2020 | Lin | H01L 23/3675 |
| 2020/0006290 A1* | 1/2020 | Chang Chien | H01L 25/50 |
| 2023/0260920 A1* | 8/2023 | Wang | H01L 25/0657 |
| | | | 257/668 |

* cited by examiner

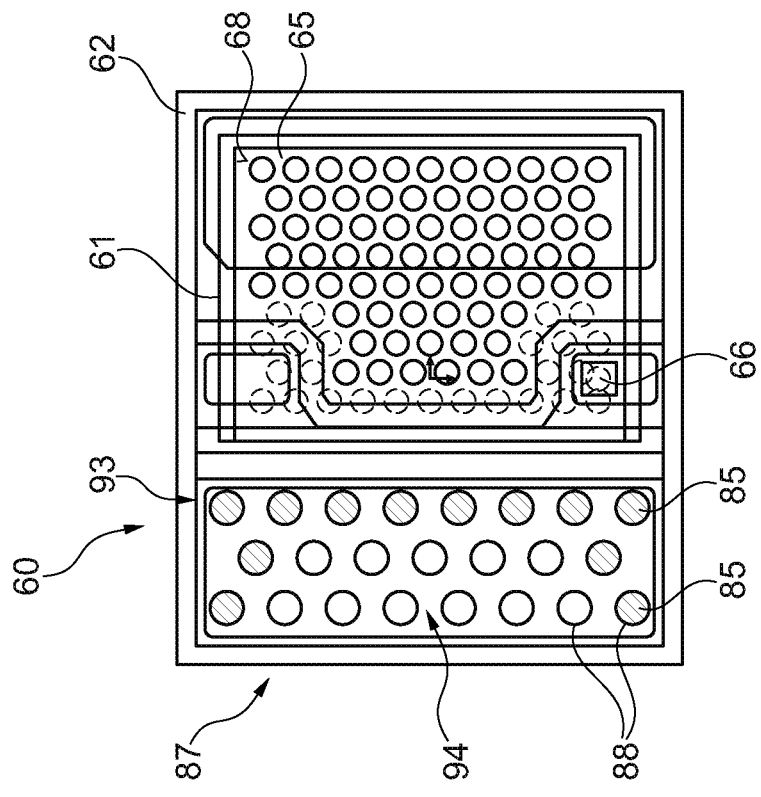
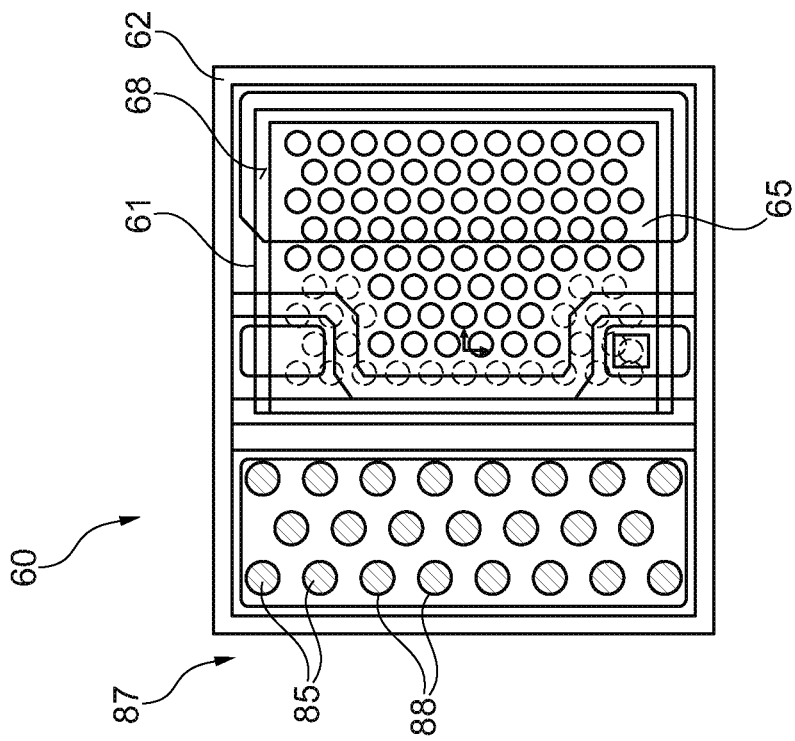
Fig. 5A
Fig. 5B

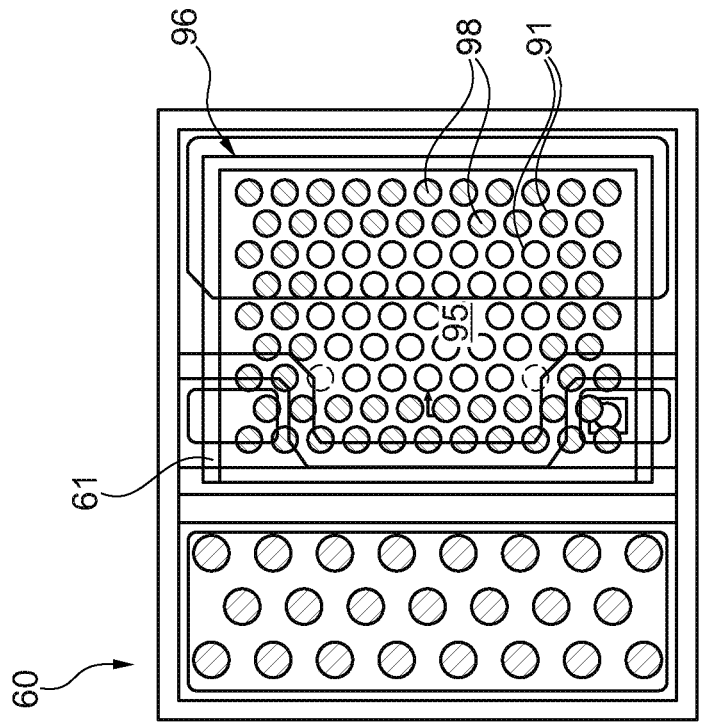
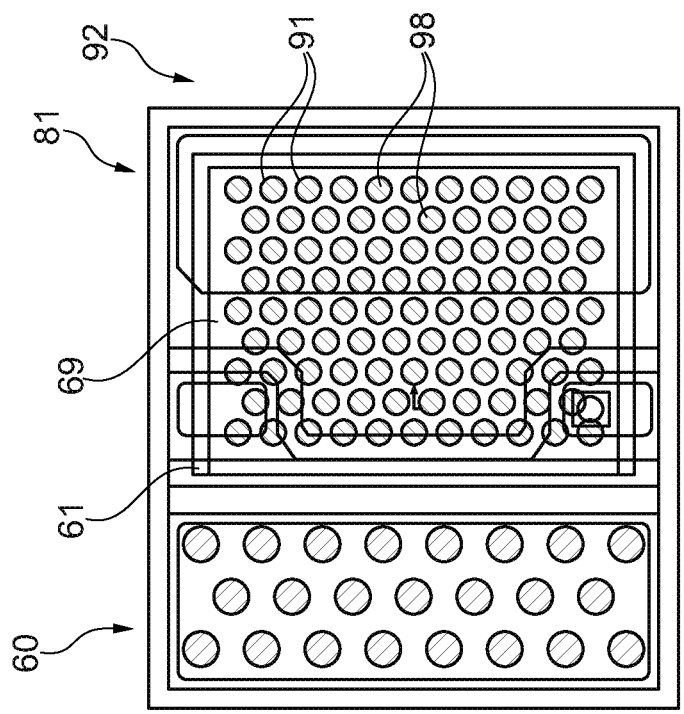

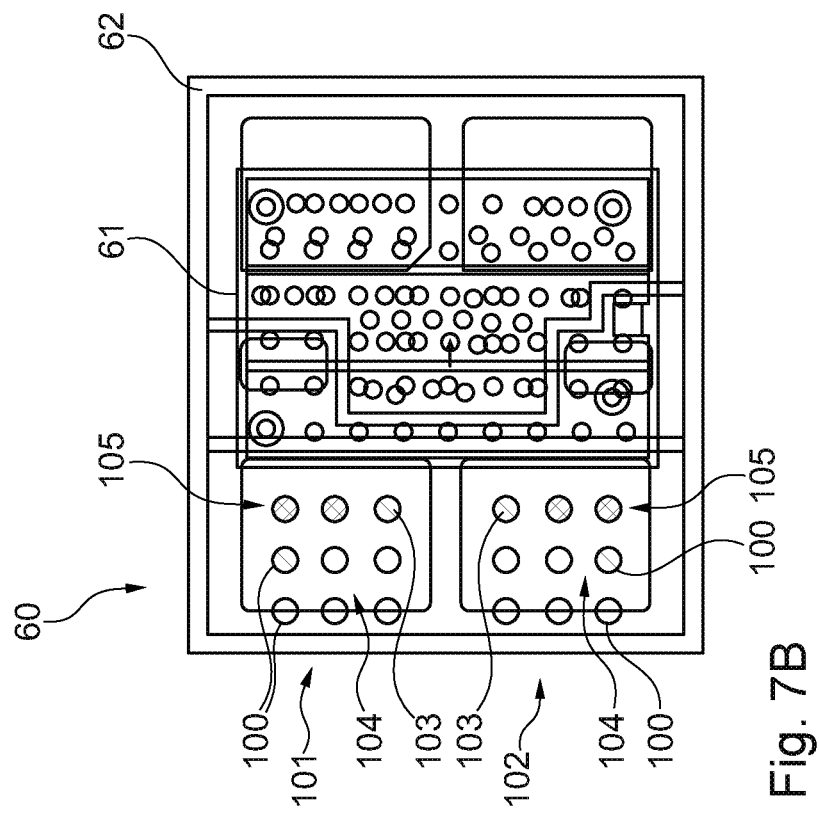
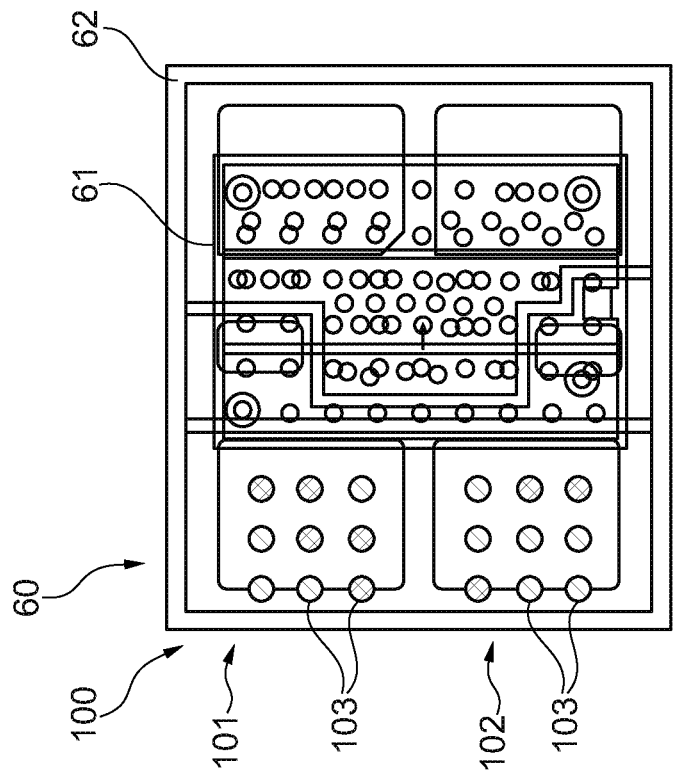
Fig. 7A
Fig. 7B

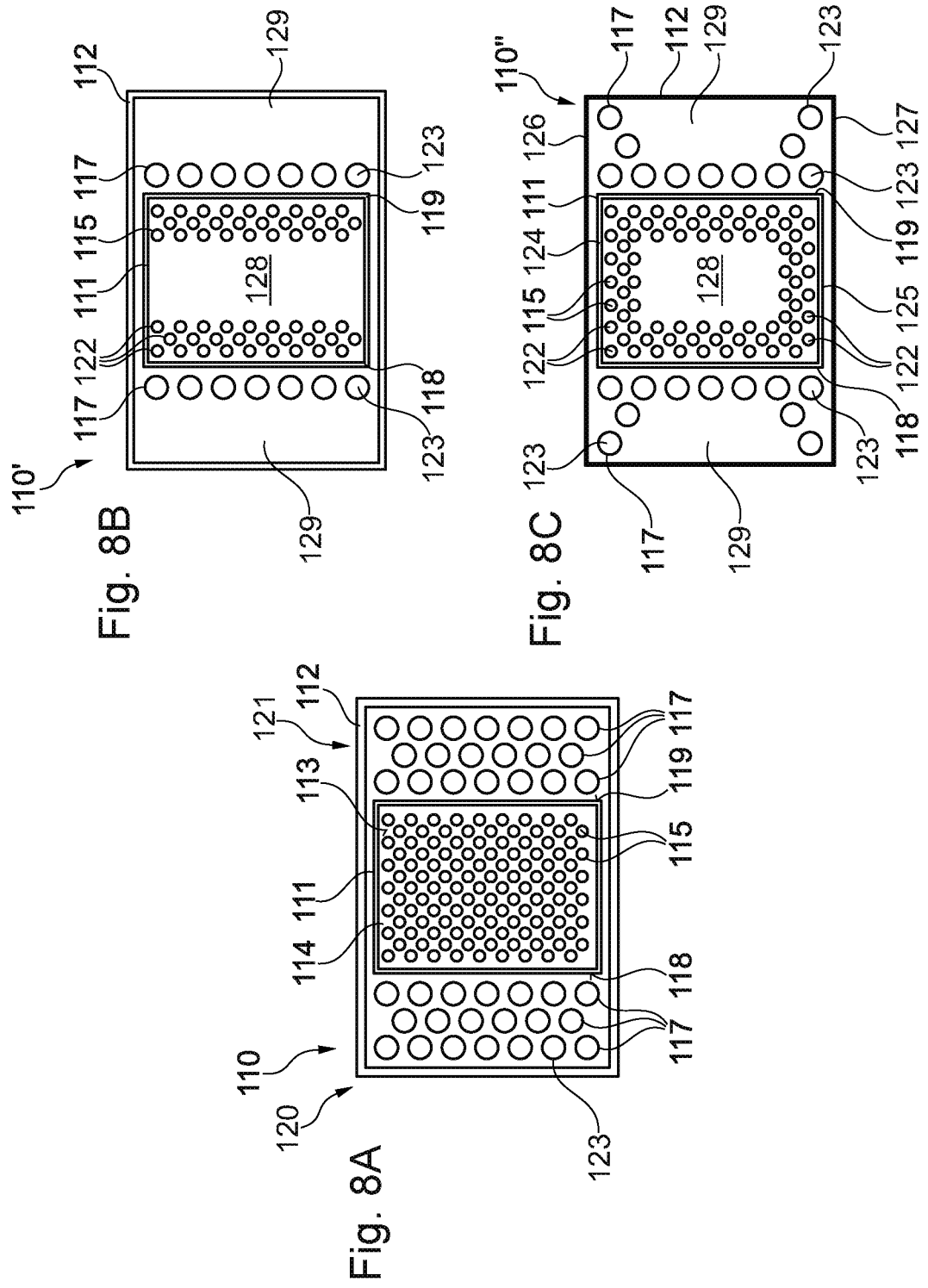

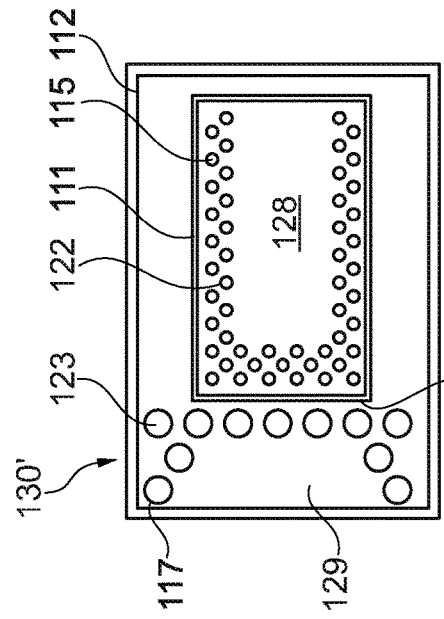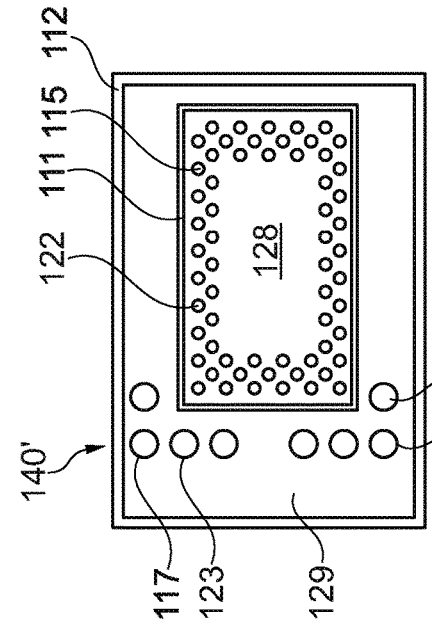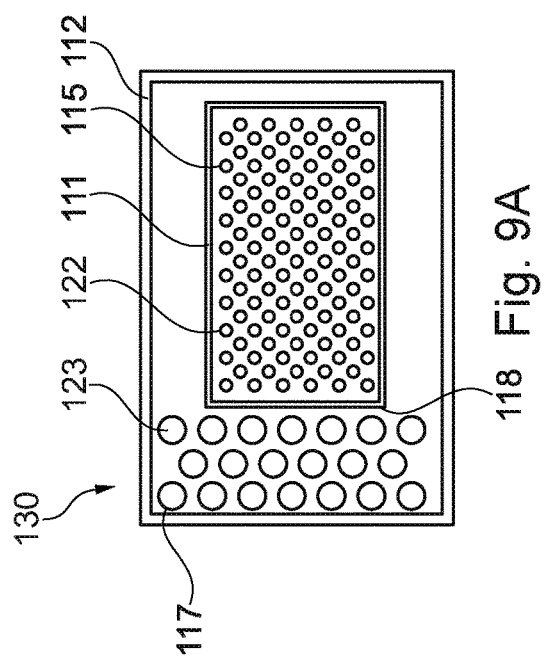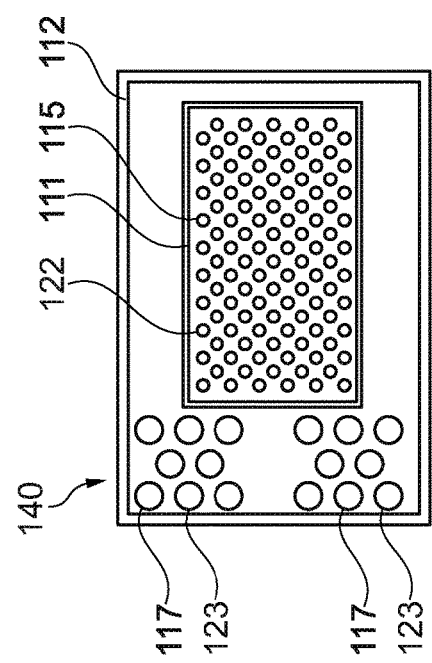

SEMICONDUCTOR PACKAGE WITH NON-UNIFORMLY DISTRIBUTED VIAS

BACKGROUND

A semiconductor package may include one or more semiconductor devices mounted on a substrate or leadframe which provides outer contacts that are used to mount the semiconductor package on a redistribution board such as a printed circuit board. The package also includes internal electrical connections, such as bond wires, from the semiconductor device to the substrate or leadframe and a housing that covers the semiconductor device and the internal electrical connections.

SUMMARY

In an embodiment, a semiconductor package comprises a semiconductor device embedded in an insulating layer, a contact pad having an area, and a vertical redistribution structure comprising multiple substantially parallel vertical paths arranged in the insulating layer and extending perpendicular to the area of the contact pad. The multiple vertical paths are non-uniformly distributed over the area of the contact pad.

In an embodiment, a method for fabricating a semiconductor package comprises providing an initial design of a semiconductor package, the initial design comprising a semiconductor die embedded in an insulating layer, a first contact pad having an area, a set of via sites forming a two-dimensional array of a first pitch on said area and conductive vias populating the via sites, passing a predetermined current from the semiconductor die to the first contact area, determining the current density in each of the populated via sites for a predetermined current flowing from the semiconductor die to the first contact area, selectively depopulating vias from a subset of the via sites and forming at least one via free-zone in the array.

In an embodiment, a method of fabricating a semiconductor package comprises embedding a semiconductor die in an insulating polymer layer, forming a first contact pad having an area and a set of via sites forming a two-dimensional array of a first pitch on the area, forming holes in the insulating layer located at selected via sites and forming a subset of via sites and at least one via-free zone within the area, inserting conductive material into the holes and forming conductive vias at the subset of via sites, and applying a conductive layer to the conductive vias to electrically couple the conductive layer to the first contact pad.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 5A and 5B illustrate respective top views of a semiconductor package.

FIGS. 6A and 6B illustrate respective top views of a semiconductor package.

FIGS. 7A and 7B illustrate respective top views of a semiconductor package.

FIGS. 8A through 8C illustrate respective top views of a semiconductor package.

FIGS. 9A and 9B illustrate respective top views of a semiconductor package.

FIGS. 10A and 10B illustrate respective top views of a semiconductor package.

DETAILED DESCRIPTION

Figure 1A:
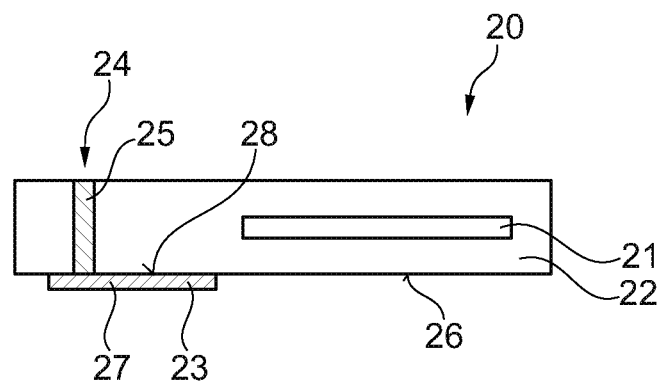
FIGS. 1A and 1B illustrate respective cross-sectional and bottom views of a semiconductor package according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A semiconductor package having a semiconductor device embedded in an insulating layer is provided that includes an improved internal redistribution structure. The internal redistribution structure includes one or more vertical redistribution structures, each including multiple vertical conductive paths which may each be provided by a conductive via. Using the methods described herein, the number of vias can be minimized and the electrical and thermal performance is affected only within tolerance limits by appropriate selection of the sites of the vias.

The behaviour of the electric field and current in the embedded chip packages is used to identify inhomogeneity in the electric field and current distribution and to identify the vias remain that "under loaded" or "cold", i.e. carry very low current, in comparison to other vias. The methods is based on the concept that the number of these "cold" or "under-loaded" vias can be significantly reduced without causing an equivalent increase of the package/device DC resistance and density of current flowing through remaining vias.

Figure 1B:
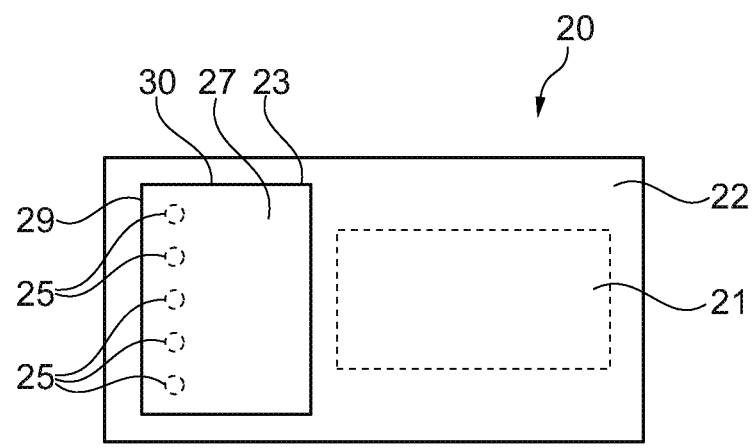

FIG. 1A illustrates a cross-sectional view and FIG. 1B illustrates a bottom view of a semiconductor package 20 according to an embodiment.

The semiconductor package 20 includes a semiconductor device 21 which is embedded in an insulating layer 22. The semiconductor package 20 further includes a contact pad 23 having an area and a vertical redistribution structure 24 comprising multiple substantially vertical paths 25 which are arranged in the insulating layer 22. The multiple vertical paths 25 may extend substantially parallel to one another and substantially perpendicular to the area of the contact pad 23. The multiple substantially vertical parallel paths 25 are non-uniformly distributed over the area of contact pad 23. Each vertical path 25 provides a conductive vertical path for carrying current. The vertical paths 25 are electrically coupled in parallel to provide the vertical redistribution structure 24.

Each individual vertical path 25 may be provided by a conductive via which extends in the insulating layer 22 and which is spaced apart from the further individual vertical paths 25 by regions of the insulating layer 22. The individual vertical paths 25 and conductive vias may extend through the entire thickness of the insulating layer 22, as illustrated in FIG. 1A. Alternatively, the individual vertical paths 25 and conductive vias may extend through only part of the insulating layer 22 or through only one or more sublayers of the insulating layer 22 and have a base positioned within the thickness of the insulating layer 22.

The insulating layer 22 may include a polymer, for example a thermosetting resin such as an epoxy resin and may be reinforced by a filler material. The filler material may include fibres such glass fibres and/or other forms such as beads. The insulating layer 22 may be provided by a dielectric core layer which is typically used in circuit board manufacturing, for example a glass fibre-reinforced epoxy resin board such as FR4.

The semiconductor device 21 may be a power device, such as a diode or a transistor. In some embodiments, the semiconductor device 21 is a vertical transistor and has at least one contact pad on two opposing major surfaces. In other embodiments, the semiconductor device 21 is a lateral device and has contact pads on only one major surface.

In the embodiment illustrated in FIGS. 1A and 1B, the contact pad 23 is arranged on a lower surface 26 of the insulating layer 22 and provides an outer contact 27 of the semiconductor package 20. The multiple vertical paths 25 extend substantially perpendicularly to the surface 28 of the contact pad 23 and substantially perpendicular to the lower surface 26 of the insulating layer 22. The surface 28 of the contact pad 23 is in direct contact with the lower surface 26 of the insulating layer 22. As can be seen in the bottom view of FIG. 1B, the multiple vertical paths 25 are arranged in a single row adjacent a side face 29 of the contact pad 23 such that the majority of the area of the contact pad 23 is free of the vertical paths 25. The multiple vertical paths 25 are laterally and spatially inhomogenously distributed over the area of the contact pad 23. The area A of the contact pad 23 is defined by the side faces 29, 30 of the contact pad 23 which have a length L1 and L2 respectively so that A=L1× L2.

The semiconductor package 20 may include a conductive redistribution structure which in addition to the vertical distribution structure 24 which includes the multiple vertical paths 25, also includes one or more lateral conductive redistribution structures. These one or more lateral redistribution structures may be used, for example, to electrically couple the semiconductor device 21 to the vertical redistribution structure 24.

The nonuniform lateral spatial arrangement of the vertical conductive paths 25 with respect to the area of the contact pad 23 is, however, not limited to embodiments in which the contact pad 23 provides an outer contact surface 27 of the package 20. For example, a contact pad on one of the major surfaces of the semiconductor device 21 may be electrically coupled to an outer contact pad or a lateral conductive redistribution structure by two or more vertical conductive paths which extend substantially perpendicular to the area of the contact pad positioned on the semiconductor device 21. These multiple conductive vertical paths are arranged non-uniformly over the area of the contact pad.

Whilst the multiple vertical paths 25 are illustrated as being positioned in a single row in FIG. 1B, the multiple vertical paths 25 may also be arranged to form an L-shape, for example by being positioned adjacent to two adjoining sides of contact pad 23, a U-shape, by being positioned adjacent three sides or an O-shape by being positioned adjacent all four sides, with the central portion of the area of the contact pad 23 remaining free of multiple contact paths. In other words, the multiple vertical paths 25 are arranged with a nonuniform density or distribution across the area of the contact pad 23 such that a portion of the area of the contact pad 23, which is free of vertical paths 25, has at least one dimension that is greater than the distance between adjacent paths 25.

The semiconductor package 20 may have a standard package outline, for example a JEDEC outline, or a standard package footprint. By reducing the number of vias and consequently, the number of holes which have to be formed in the insulating layer, manufacturing can be simplified and manufacturing time reduced. Additionally, the materials usage is reduced, since the number of vias is reduced.

Figure 2:
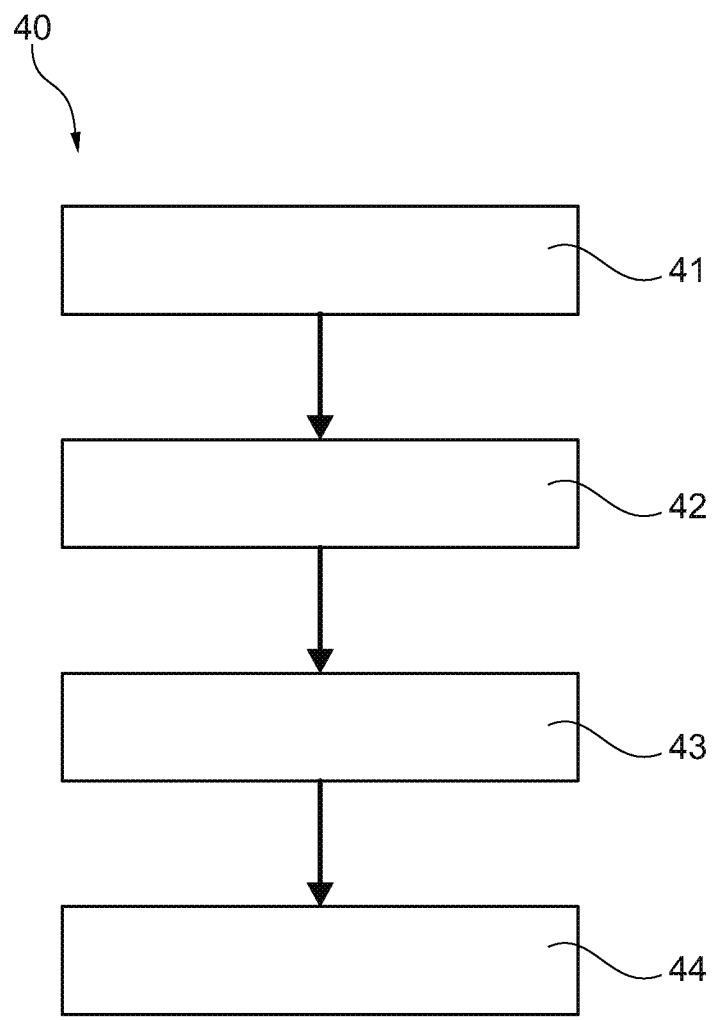
FIG. 2 illustrates a flowchart of a method for fabricating a semiconductor package according to an embodiment.

FIG. 2 illustrates a flowchart 40 of a method for fabricating a semiconductor package. In block 41, an initial design of the semiconductor package is provided. In this embodiment, the semiconductor package is a so-called embedded die package. The semiconductor package may have a standard package outline, for example a JEDEC outline, and/or a standard package footprint. The initial design may include a semiconductor die embedded in an insulating layer, a first contact pad having an area, a first set of via sites forming a two-dimensional array having a first pitch on the area of the first contact pad and vias populating the via sites. In the initial design, all of the via sites of the two-dimensional array may be populated by a conductive via and the array may be uniformly distributed through the area.

In block 42, a predetermined current is passed from the semiconductor die to the first contact area. In block 43, the current density in each of the populated via sites or, more specifically in each of the conductive vias populating the via sites, is determined for the predetermined current flowing from the semiconductor die to the first contact area. In block 44, one or more vias are selectively depopulated form a subset of the via sites and at least one via-free zone is formed in the area of the contact pad and in the two-dimensional array of via sites.

Since the vias have been depopulated from some of the via sites of the two-dimensional array, a first subset of via sites that include vias is formed in the array and the via sites that are free from vias form a via-free zone in the array. After the vias have been selectively depopulated and the first subset of populated via sites and at least one via-free zone is formed in the array, the total number of conductive vias has been reduced compared to the initial design. Due to the formation of the via-free zone in the array, the vias are no longer uniformly distributed over the area of the contact pad and, in particular, within the area of the contact pad in which the via sites are positioned.

In some embodiments, the total cross-sectional area of the conductive material of the conductive vias is reduced as the cross-sectional area of each of the individual remaining conductive vias remains the same.

The current density in each of the individual conductive vias positioned at the via sites in the two-dimensional array of the initial design can be nonuniform in that some of the vias carry a higher current density than other ones of the vias for the predetermined current. In some embodiments, vias are depopulated from via sites at which the determined current density is smaller than in other ones of the via sites in order to form the via-free zone in the array. Therefore, vias identified as carrying a lower current density are selectively depopulated in this embodiment.

The effect of the depopulation of these particular via sites can be investigated by repeating the method by passing the predetermined current from the semiconductor die to the first contact area, with some of the vias having been depopulated and the contact pad including a via-free zone. If the current density for one or more of the remaining vias is within a predetermined range of a predetermined threshold value, the subset of the populated via sites, that is the positions of the remaining vias, and/or the subset of the depopulated via sites and/or the position of the via-free zone can be saved in the form of a dataset for a revised design of the semiconductor package.

The dataset may be used when fabricating the semiconductor package in order to position the holes in the insulating layer at the populated via sites of the final design, whereby the via-free zone remains covered by the insulating layer. The vias can then be fabricated by inserting conductive material into the via, for example by electroplating the sidewall of the holes and/or by filling the holes with conductive material in order to form the multiple substantially vertical conductive paths that are electrically coupled in parallel to provide a single vertical redistribution structure between two planes. As discussed above, the subset of populated via sites and, therefore, conductive vias may form an O-shape, U-shape or L-shape on the area of the contact pad.

In some embodiments, if the current density in one or more of the vias exceeds a predetermined threshold value, for example if too many of the vias are removed and/or particular ones of the vias are removed, one or more via sites can be repopulated and the method repeated. If the current density exceeds the predetermined threshold, this may lead to undesirable losses. By reducing the number of vias and consequently, the number of holes which have to be formed in the insulating layer compared to the initial design, manufacturing can be simplified and manufacturing time reduced. Additionally, the materials usage is reduced, since the number of vias is reduced compared to the initial design.

The package outline as well as the package footprint may remain unaltered despite the new structure of the vertical redistribution structure, since the vertical redistribution structure is positioned within the package and, in particular, within the insulating layer, in which the semiconductor device is embedded.

Using the methods described herein, the number of vias can be minimized and the electrical and thermal performance is affected only within tolerance limits by selection of the sites of the vias to be depopulated. Simulations can be used to investigate the behaviour of the electric field and current in embedded chip packages and indicate any non-homogeneity so that vias that remain "under loaded" or "cold", i.e. carry very low current, in comparison to other vias can be identified. The depopulation method is based on the concept that the number of these "cold" or "underloaded" vias can be reduced without causing an equivalent increase of the package/device DC resistance and density of current flowing through remaining vias. This balance can be achieved by selection of the number, position and density of vias in accordance with the field and current distribution in the package layers. In other words, vias positioned in areas of high concentration of the electric field are kept and vias in areas having a low electric field, i.e. in the "cold" areas are removed (or the number reduced).

For this purpose, the two-dimensional array of via sites may be divided into two regions: region I which includes "loaded" vias having a normal current density, and region II where "cold" vias with a reduced current density (or even without vias) are located. A cost reduction in terms of manufacturing time and a reduction in materials usage can be achieved by decreasing the total number of vias with only small impact on the device Rds(on) and without exceeding limits imposed on maximum current through a via.

The proposed methodology can be also applied to regroup vias, for example put more vias in the areas of electric current hot spots and vice versa, to increase the product performance and reduce resistance without increase of costs, assuming that the total number of vias remains the same.

Figure 3:
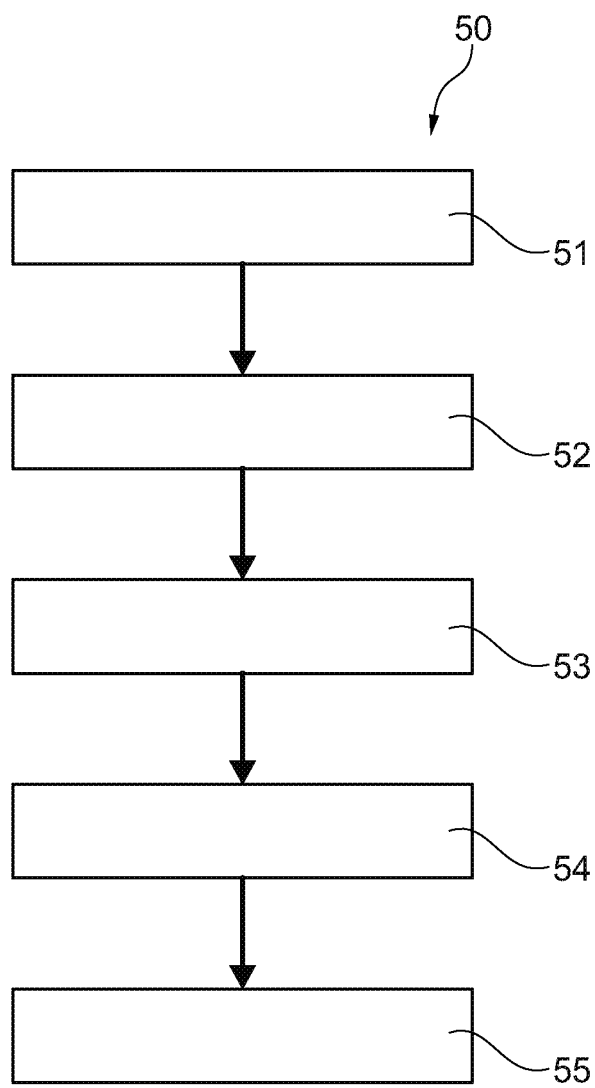
FIG. 3 illustrates a flowchart of a method for fabricating a semiconductor package according to an embodiment.

FIG. 3 illustrates a flowchart 50 of a method of fabricating a semiconductor package. In block 51, a semiconductor die is embedded in an insulating layer, for example an insulating polymer layer. The insulating polymer layer can include a resin, such as an epoxy resin and a reinforcement filler, such as glass fibres. The insulating layer may be provided by a dielectric core layer which is typically used in circuit board manufacturing, for example a glass fibre-reinforced epoxy resin board such as FR4.

In block 52, a first contact pad having an area is formed. The area of first contact pad has a set of via sites forming a two-dimensional regular array of the first pitch.

In block 53, holes are formed in the insulating layer located at selected ones of the via sites of the two-dimensional array, whereby a subset of via sites is formed which includes holes and at least one via-free zone without holes is formed within the area of the first contact pad.

In block 54, conductive material is inserted into the holes and conductive vias formed at the subset of via sites. The conductive material may be inserted into the holes by electroplating.

In block 55, a conductive layer is applied to the conductive vias to electrically couple the conductive layer to the first contact pad.

The conductive layer may be a lateral conductive redistribution layer of the semiconductor package which extends horizontally and, therefore, perpendicularly to the vertical vias and which electrically couples the first contact pad to the semiconductor die. In some embodiments, the first contact pad is positioned on the semiconductor die and the lateral conductive layer electrically couples the semiconductor die by way of the first contact pad and the vias to a further contact pad or a further vertical redistribution structure. In other embodiments, the first contact pad is positioned on the semiconductor die and the lateral conductive layer forms, or is arranged on, an outer contact pad of the semiconductor package.

In some embodiments, the semiconductor package includes two or more contact pads each being coupled to a vertical redistribution structure that includes multiple vertical conductive paths, which are positioned at a subset via sites on each contact pad such that each contact pad has at least one via-free zone. The conductive paths are spatially arranged in an inhomogeneous manner and with a nonuniform density on the area of the respective contact pad. Each vertical conductive path may be provided by a conductive via. The number of conductive paths and its cross-sectional area as well as the shape formed by the occupied or populated via sites may be the same or vary for each contact pad.

FIGS. 4A through 4F illustrate respective partially transparent top views and cross-sectional views of a semiconductor package 60 including an embedded semiconductor device 61.

The semiconductor package 60 may be called an embedded package, since the semiconductor device 61 is embedded in an insulating layer 62 which supports the outer contact pads 63. The outer contacts 63 are arranged on a first major surface 64 of the insulating layer 62 and provide the footprint of the package 60. The outer contact pads of the package 60 may be characterised by a solderable coating.

The insulating layer 62 may be polymer-based and may include a thermosetting resin and filler material for reinforcement. In some embodiments, the insulating layer 62 may include an epoxy resin and fibre reinforcement, for example glass fibre reinforcement. In some embodiments, the insulation layer 62 may include a core layer as is typically used in circuit board manufacture such as FR4.

The insulating layer 62 may include two or more sublayers. For example, the semiconductor device 61 may be embedded in a core layer and one or more further layers may be arranged on the semiconductor device. The further layer or layers may include a polymer such as a thermosetting resin, for example an epoxy resin. The core layer may include a substantially planar prefabricated board including a material such as glassfibre reinforced matrix, or other material, which is typically used to fabricate a core layer for a printed circuit board. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example. A conductive layer positioned on one or both of the major surfaces.

The semiconductor device 61 may be a so-called vertical semiconductor device which includes contact pads on two opposing major surfaces. In some embodiments, the semiconductor device 61 is a transistor device, such as a MOSFET (Metal Oxide Semiconductor Field Effect Transistor) device or IGBT (Insulated Gate Bipolar Transistor), that includes a vertical drift path.

In the embodiment illustrated in FIGS. 4A through 4F, the semiconductor device 61 includes a source pad 65 and a gate pad 66 on a first major surface 68 which faces towards the first major surface 64 and the outer contact pads 63 of the semiconductor package 60. The semiconductor device 61 further includes a drain pad 69 on the second major surface 70 which opposes the first major surface 64 of the semiconductor device 61. The drain pad 69, therefore, faces in the opposing direction to the source pad 65 and gate pad 66 and towards a second major surface 71 of the insulating layer 62. As the semiconductor device 61 and the device contact pads 65, 66, 69 are embedded within the insulating layer 62, the semiconductor package 60 includes a conductive redistribution structure 72 for electrically coupling the contact pads 65, 66, 69 of the semiconductor device 61 to the outer contact pads 63 which are positioned on the first major surface 64 the insulating layer 62.

The conductive redistribution structure 72 includes a first plurality of conductive vias 73 which provide a first vertical redistribution structure 74 including multiple substantially parallel substantially vertical paths that are electrically coupled in parallel. Each conductive via 73 provides one of the multiple substantially parallel substantially vertical paths. The vias 73 extend substantially perpendicular to the surface and area of the source pad 65 on the semiconductor device 61 and extend to a first lateral conductive layer 75 which is positioned at the first major surface 64 the insulating layer 62. The outer contact pads 63 of the package footprint include two source contact pads 76, 77 which are arranged on the first lateral conductive layer 75. The first conductive layer 75 may provide a fan out redistribution, at least to a certain extent for the source contact pads 76, 77 of the package footprint in relation to the source pad 65 on the semiconductor device 61. The contact pads 76, 77 of the package footprint may be laterally smaller than the conductive layer 75. Regions of the first conductive layer 75 which are not covered by the contact pad 76, 77 may be covered by an insulation layer which may be provided by a portion of the insulating layer 62.

The gate pad 66 is positioned towards an edge of the first major surface 68 of the semiconductor device 61. The gate pad 66 of the semiconductor device 61 includes a second vertical redistribution structure 78 which includes a via 79 positioned on each of the gate pad 66 which extends substantially perpendicular to the first major surface 68 of the semiconductor device 61 to a second lateral conductive layer 80 which is positioned at the first major surface 64 of the insulating layer 62. The second lateral conductive layer 80 may be substantially coplanar with the first lateral conductive layer 75 and is spaced apart and electrically insulated from the first lateral conductive layer 75 by intervening regions of the insulating layer 62.

The package footprint includes two gate outer contact pads 81, 82 which are substantially coplanar with the source outer contact pads 76, 77. The second lateral conductive layer 80 extends across the width of the insulating layer 62 and between the two outer contact pads providing the two gate contact pads 81, 82 of the package 60. The two contact pads 81, 82 are positioned on the second conductive layer 80 and provide two gate pads in the footprint of the semiconductor package 60.

The drain pad 69 positioned on the second major surface 70 of the semiconductor device 61 is electrically connected to a third lateral conductive redistribution layer 81, which is positioned on the second major surface 71 of the insulating layer 62, by a third vertical redistribution structure comprising a plurality of parallel conductive paths each provided by a conductive via 82. The conductive vias 82 extend substantially perpendicularly between the drain pad 69 and the third lateral conductive layer 81 to provide substantially vertical parallel conductive paths between the drain pad 69 and the third lateral conductive layer 82.

The third lateral conductive layer 81 is electrically coupled by a third plurality of conductive vias 85 to two outer contact pads 63 providing drain outer contact pads 83, 84 which are positioned on the first major surface 64 of the insulating layer 62. The third plurality of conductive vias 85 are positioned adjacent to and spaced apart from a side face of the semiconductor device 61. The third plurality of conductive vias 85 extend through the insulating layer 62 from the third lateral conductive layer 81 to a fourth lateral conductive layer 86 which is positioned at the first major surface 64. The two drain contact pads 83, 84 of the package 60 are positioned on the fourth lateral conductive layer 86. The fourth lateral conductive layer 86 is substantially coplanar with the first and second lateral conductive layers 75, 80 and is spaced apart and electrically insulated from these by portions of the insulating layer 62.

Figure 4E:
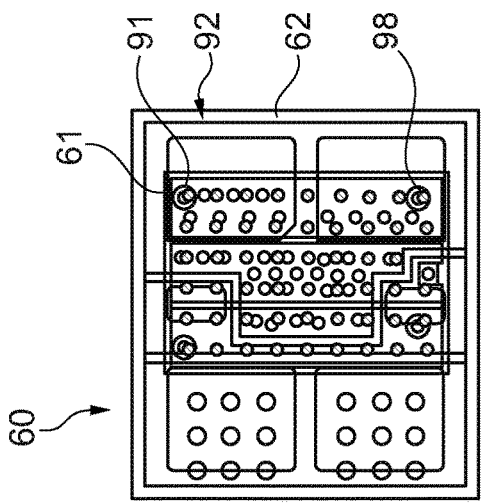
FIGS. 4A through 4F illustrate respective partially transparent top and cross-sectional views of a semiconductor package including an embedded semiconductor device according to an embodiment.
Figure 4C:
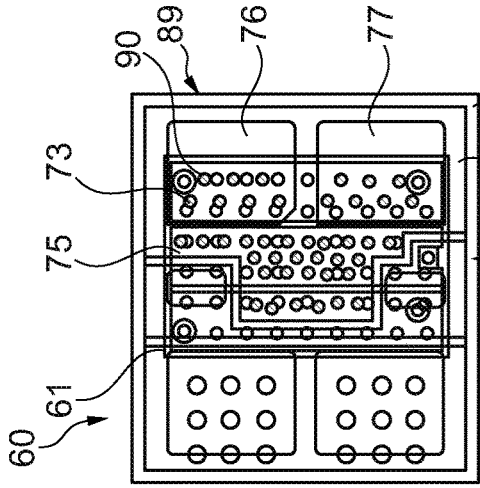
Figure 4A:
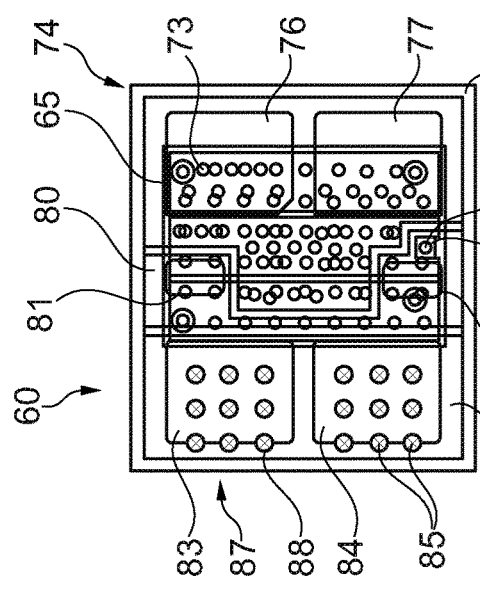
Figure 4F:
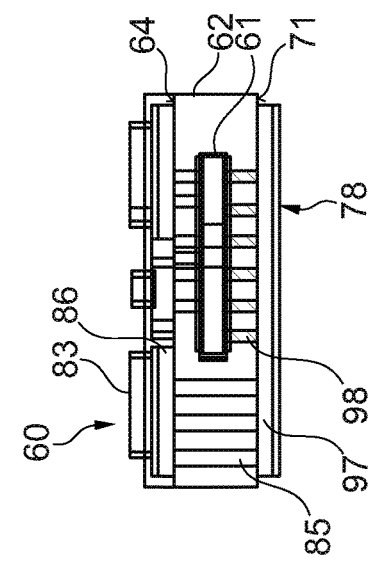
Figure 4D:
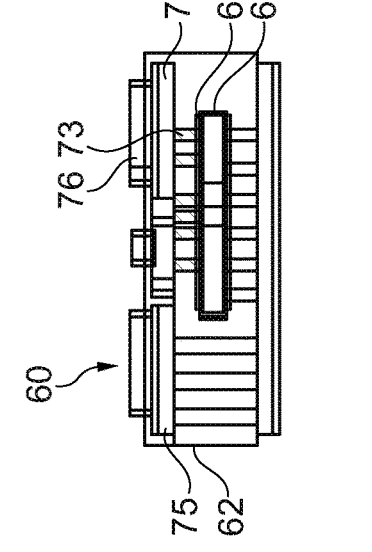
Figure 4B:
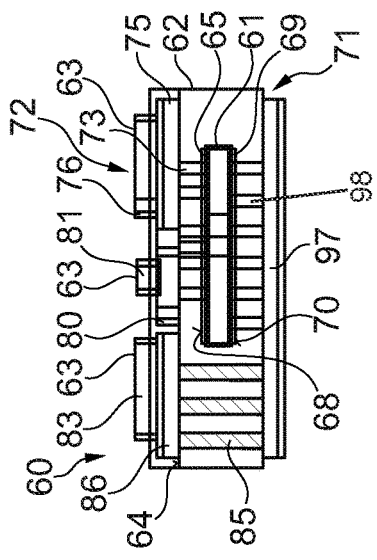

FIG. 4A illustrates a top view and FIG. 4B illustrates a cross-sectional view in which the position of the third plurality of conductive vias 85 are highlighted. The third plurality of conductive vias 85 are arranged in two groups of nine vias, each group having a two-dimensional array 87 of via sites 88 having a first pitch. A conductive via 85 is positioned at each via site 88.

FIG. 4C illustrates a top view and FIG. 4D a cross-sectional view in which the position of the first plurality of vias 73 are highlighted. The first plurality of vias 73 are also arranged at via sites 90 which form a two-dimensional array 89 having a second pitch.

FIG. 4E illustrates a top view and FIG. 4F a cross-sectional view in which the position of the third plurality of vias 82 is highlighted. The third plurality of vias 82 are arranged at via sites 91 which are arranged in a two-dimensional array 92 having a third pitch.

The first, second and third pitches may be the same. In some embodiments, the pitch of the array of the contact pads arranged on the semiconductor device is smaller than the pitch of the array for the through package vertical conductive connection. In the embodiment illustrated in FIGS. 4A through 4F, the first pitch may be larger than the second pitch and the third pitch.

In the semiconductor package 60 illustrated in FIGS. 4A through 4F, the via sites 88, 90, 91 of each vertical redistribution structure of the semiconductor package 60 are occupied or populated by a perspective conductive via 85, 73, 82. As discussed above, these conductive vias extend through at least a portion of the insulating layer 62. In order to form these conductive vias 85, 73, 82, a hole is first formed in the insulating layer and the hole at least lined or filled with conductive material.

Commonly, the position and pitch or spacing between the conductive vias of the arrays 87, 89, 92 as well as the diameter of each of the conductive vias is selected so as to reduce the resistance of the conductive path between the two surfaces which are to be electrically connected, for example, the fourth conductive layer 86 and the third conductive layer 82 that are electrically coupled by the vias 85. By increasing the number of vias, the cross-sectional area of conductive material is increased, and the resistance of the connection reduced, for a particular conductive material.

However, the fabrication of the holes in the insulating layer 62 can be time-consuming and expensive. For example, for insulating layers including fibre reinforced epoxy resin, the holes forming the vias are inserted by drilling and, consequently, are formed serially one after another. The inventors have discovered that by an improved positioning of the conductive vias for a particular vertical redistribution structure and application, the number of vias can be reduced without increasing the package resistance and losses by a corresponding amount. Consequently, manufacturing time and costs and materials usage can be reduced.

FIG. 5A illustrates a top view of a set of via sites for the third vertical redistribution structure of the package illustrated in FIGS. 4A through 4F. For embodiments in which two drain outer contacts 83, 84 are provided, the set of via sites 88 are arranged in a two-dimensional array 89 of offset rows such that the pitch between adjacent via sites 88 of the array 89 is substantially the same. This type of two-dimensional array can also be described as a hexagonal close packed arrangement. In FIG. 5A, each of the via sites 88 is occupied or populated by via 85.

FIG. 5B illustrates the vertical connection structure after the depopulation of some of the via sites 88 so that a subset of via sites 93 is formed that is occupied or populated with the vias 85. In this embodiment, the subset of populated via sites 93 includes the outermost via site 88 of the rows along two opposing sides of the array 89 and the entire row which faces towards the semiconductor device 61. The populated via sites 88 can be considered to form a general U-shape, with the base of the U facing towards the side face of the semiconductor device 61 and the arms extending towards the outermost side face of the insulating layer 61 and away from the side face of the semiconductor device 61. A via-free zone 94 is formed in the array 87 by the via sites that remain unpopulated by vias. The via-free zone is surrounded on three sides by populated via sites 88 of the subset of populated vias of the subset 93. The vias 85 are non-uniformly distribution over the area of the contact pad.

FIG. 6A illustrates a top view of an array 92 of via sites 91 for the second vertical redistribution structure 81 which extends from the drain pad 69 to the third lateral conductive layer 82. The set of via sites 91 is arranged in a two-dimensional array 92 of offset rows and may also be described as having a hexagonal close packed arrangement, in which the pitch between adjacent via sites 91 is substantially equal. In the example illustrated in FIG. 6A, each of the via sites 91 of the array 92 is occupied or populated by a conductive via 82.

FIG. 6B illustrates an embodiment in which some of the via sites 91 have been depopulated and remain unoccupied by a conductive via to form a via-free zone 95. The via-free zone 95 is positioned in towards the centre of the array 92 of via sites 91. The array of via sites 91 includes a subset of populated via sites 96 which are arranged towards the edges of the array 92, such that the two outermost rows of the array 92 are populated by vias 82 and such that the outermost two via sites 91 of the intervening rows are populated by vias 82. The arrangement can be considered to be a ring or O shape of occupied via sites 96 surrounding a central via-free zone 95.

FIG. 7A illustrates a top view of a set of via sites 100 which are clustered in two groups 101, 102, whereby each group 101, 102 includes a two-dimensional array of via sites 100 having a pitch. In this embodiment, the via sites 100 is arranged in rows and columns. In FIG. 7A, each of the via sites 100 is populated with a conductive via 103.

FIG. 7B illustrates an embodiment in which some of the via sites 100 have been depopulated to form a via-free zone 104 and a subset 105 of via sites which are populated by vias 103.

In the embodiment illustrated in FIG. 7B, the populated via sites 105 are arranged to form an L-shape in which the row of each cluster 101, which is adjacent the semiconductor device 61, is populated by a via 103. A via site of the adjacent row of the array, that is positioned adjacent two opposing side edges of the package 60, is populated and occupied by a via 103.

The packages of FIGS. 4A to 7B can be considered to have a unidirectional current flow from the drain pad 69 positioned on the semiconductor device 61 to the drain outer contacts 83, 84 of the package footprint, since the drain outer contacts 83, 84 are positioned adjacent a single side of the semiconductor device 61. In other embodiments, a bidirectional or multidirectional current flow between the drain pad positioned on the semiconductor device and the drain outer contacts of the package footprint may be provided. For example, the drain outer contact pads may be positioned adjacent two or more opposing side faces of the semiconductor device to provide a bidirectional current flow. The principle of depopulated via sites to produce a via-free zone and a subset of populated via sites can also be used for these types of semiconductor packages.

In semiconductor packages in which there are two or more vertical redistribution structures including multiple vertical current carrying paths, each of the vertical redistribution structures may include an arrangement of a via-free zone and a subset of populated via sites. The arrangement of the populated vias may differ for each vertical redistribution structure. The diameter of the via sites and, consequently, the diameter of a conductive via positioned at the populated via sites may vary for two or more of the vertical redistribution structures. For example, the plurality of vias used for the source vertical redistribution structure may have a different diameter and a different spatial distribution from the plurality of vias used for the drain connection that extends through the thickness of the package.

Further embodiments of packages including partially and non-uniformly populated arrays of via sites are illustrated in FIGS. 8A to 11B.

FIG. 8A illustrates a top view of a portion of a semiconductor package 110 including a semiconductor device 111 embedded in an insulating layer 112. The semiconductor device may be a transistor device such as a MOSFET and may be a vertical MOSFET device with contact pads on opposing surfaces and a vertical drift path.

The upper surface 113 of the semiconductor device 111 includes a drain contact pad 114 which includes a plurality of via sites 115 arranged in a two-dimensional array having a pitch P1 between adjacent via sites 115. Adjacent rows of the two-dimensional array are offset with respect to one another to create a hexagonal close packed arrangement. The semiconductor device 111 includes a source and a gate contact pad on its opposing lower surface that cannot be seen in the view of FIGS. 8A through 8C. The drain contact pad 114 is electrically coupled to outer contact pads positioned on the lower surface of the insulating layer 112 by a vertical redistribution structure including a plurality of conductive paths situated at plurality of second via sites 117 which are positioned adjacent to opposing side faces 118 119 of the semiconductor device 111. The second via sites 117 can be considered to be positioned in two clusters 120, 121, whereby each cluster 120, 121 has via sites arranged in three offset rows. However, any number of rows may be used. Each cluster 120, 121 is electrically coupled to a separate drain outer contact pad. The two drain outer contact pads are positioned adjacent opposite side faces of the semiconductor device 111 and in a plane behind the plane of the drawing.

FIG. 8B illustrates the package 110' with a partial occupation of the first via sites 115 and the second via sites 117 in both the first cluster 120 and the second cluster 121. In the embodiment illustrated in FIG. 8B, the three outermost rows of the first via sites 115 adjacent opposing side faces 118, 119 of the semiconductor device 111 are occupied by vias 122. The vias 122 can be called microvias. The innermost row of the second via sites 117 of the first and second clusters 120, 121 which is positioned adjacent the side faces 118, 119 of the semiconductor device 111 are occupied or populated by second vias 123. The second vias 123 extend throughout the thickness of the insulating layer and may be lined by conductive material, for example one or more layers of a metal or alloy. The remaining ones of the first via sites 115 and second via sites 117 remain unoccupied and form via-free zones 128, 129, respectively. In the embodiment illustrated in FIG. 8B, the populated via sites 115, 1117 and the via-free zones 128. 129 can be considered to have a substantially stripe form.

FIG. 8C illustrates a semiconductor package 110" with an alternative arrangement of the populated via sites in which the outermost three rows of the first via sites 115 adjacent the four sides 118 119 124 125 of the semiconductor device 111 are populated by vias 122. The populated first via sites can be considered to form a ring. A via-free zone 128 is positioned substantially in the centre of the semiconductor device 111. The second via sites 117 which are positioned adjacent the side faces 118, 119 of the semiconductor device 111 and adjacent opposing edges 126, 127 of the package footprint are populated by conductive vias 123. The second via sites 117 populated by vias 123 are arranged in a U-form and surround three sides of the via-free zone 129.

FIG. 9A illustrates a top view of a semiconductor package 130 according to an embodiment. The semiconductor package 130 includes the semiconductor device 111 embedded in the insulating layer 112 and includes first via sites 115 on a semiconductor device 111 and second via sites 117 positioned in the insulating layer 112.

FIG. 9A illustrates a semiconductor package 130 in which the first via sites 115 and the second via sites 117 are fully populated and FIG. 9B illustrates the semiconductor package 130' with partially populated first and second via sites 115, 117.

In contrast to the embodiment illustrated in FIG. 8A, the semiconductor package 130 includes a single outer drain contact pad which is positioned in a plane behind the plane of the drawing and which is positioned adjacent one side face, for example side face 118 of the semiconductor device 111. The drain outer contact pad is electrically coupled to the drain contact pad 114 on the upper surface 113 of the semiconductor device 111 by the plurality of second via sites 117 which are positioned adjacent to the side face 118 of the semiconductor device 111. The second via sites 117 are arranged in a plurality of offset rows in a two-dimensional array having a second pitch P2.

As in the embodiment illustrated in FIG. 8A, the semiconductor device 111 of the embodiment illustrated in FIG.

9A includes the drain contact pad 114 and the plurality of first via sites 115 arranged in a two-dimensional array having a first pitch P1 between adjacent via sites 115. The rows of the two-dimensional array are offset to create a hexagonal close packed arrangement. The first pitch P1 is smaller than the second pitch P2 in this embodiment.

FIG. 9B illustrates the semiconductor package 130' after the depopulation of vias from some of the first via sites 115 on the semiconductor device 111 and from some of the second via sites 117 positioned in the insulating layer 112. The first via sites 115 positioned on three sides of the semiconductor device 111 are occupied by conductive vias 122 to form a general U-shape, whereby the base of the U is positioned adjacent the plurality of second via sites 117. A via-free zone 128 is formed which extends to the side face 119 of the semiconductor device 111. Of the second via sites 117, the outermost second via sites are populated by a via 123 on three sides of the two-dimensional array to form a general U-shape in which the base of the U faces towards the side face 118 of the semiconductor device 111. A via-free zone 129 is formed which is surrounded on three sides by the occupied second via sites 117 and has an open side facing towards the outermost edge of the semiconductor package 130.

FIG. 10A illustrates a semiconductor package 140 in which the first via sites 115 and the second via sites 117 are fully populated and FIG. 10B illustrates the semiconductor package 140' with partially populated first and second via sites 115, 117.

FIG. 10A illustrates a semiconductor package 140 which includes two drain contact pads positioned in a plane behind the plane of the drawing. The two drain contact pads are positioned adjacent a common side of the semiconductor device and, in particular, the side face 118 and are electrically coupled to the drain contact pad 114 by the plurality of second vias 117 associated with each outer contact pad. A plurality of first via sites 115 is also positioned on the upper surface 113 of the semiconductor device 111.

FIG. 10B illustrates the semiconductor package 140' after the depopulation of some of the first via sites 115 and some of the second via sites 117. The first via sites 115 adjacent four sides of the semiconductor device 111 are populated with vias 122 such that the vias 122 are arranged in a substantial O shape and surround a via free zone 128. Of the second via sites 117, via sites forming an L-shape are occupied by vias 123 which, in the embodiment illustrated in FIG. 10B, are positioned around the corner formed between the side face 118 and side faces 125 of the semiconductor device 111.

Figures 11A, 11B:
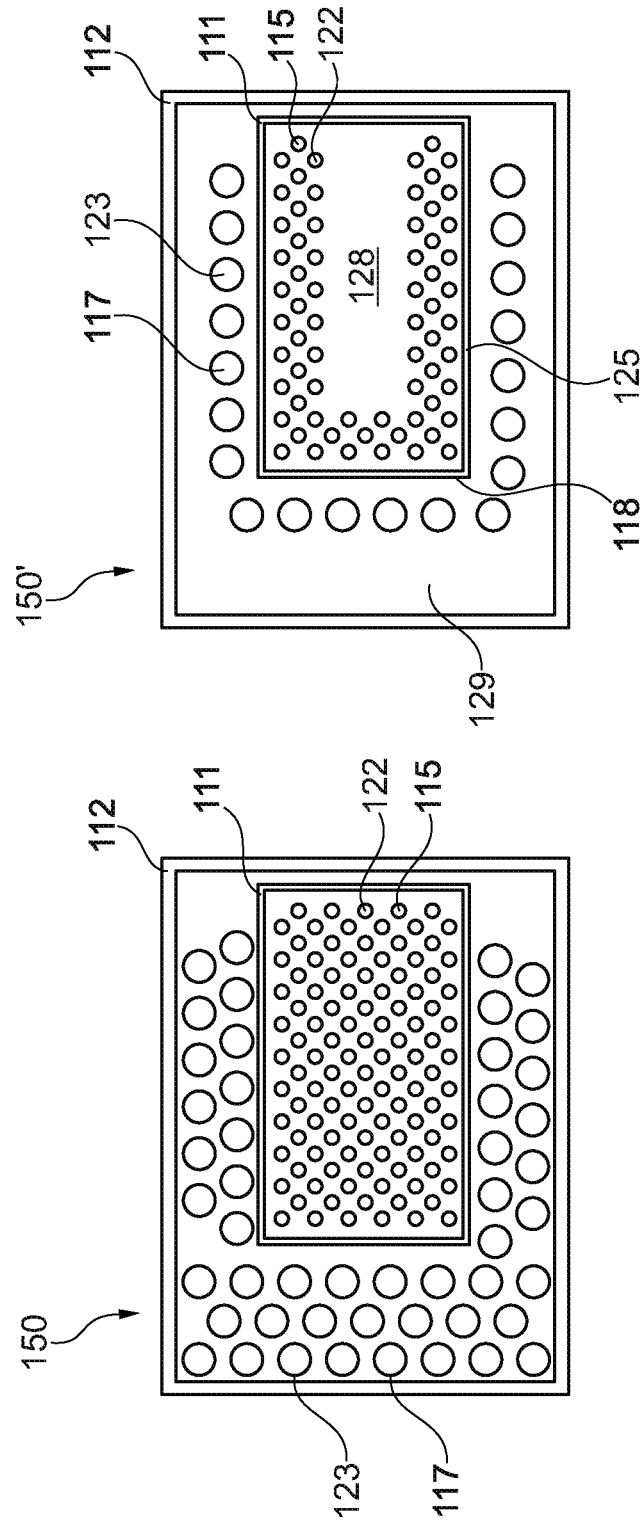
FIGS. 11A and 11B illustrate respective top views of a semiconductor package.

FIG. 11A illustrates a semiconductor package 150 in which the first via sites 115 and the second via sites 117 are fully populated and FIG. 11B illustrates the semiconductor package 150' with partially populated first and second via sites 115, 117.

In the embodiment illustrated in FIG. 11A, the second via sites 17 are positioned adjacent three sides 124, 118, 125 of the semiconductor device 111. The semiconductor package 150 may include a single outer drain contact pad which has a general U-shape and is positioned adjacent three sides of the semiconductor device 111. This arrangement can be considered to provide a tri-directional current flow.

In the semiconductor package 150' illustrated in FIG. 11B, a single row of the second via sites 117 is occupied by via 123 such that a single row of vias 123 is positioned adjacent three sides 124, 118, 125 of the semiconductor device 111. As in the embodiment illustrated in FIG. 11A, the first via sites 115 positioned adjacent three sides of the semiconductor device 111 are occupied by vias 122 with the base of the U being arranged substantially parallel to the base of the U-shape formed by the vias 123 positioned in the populated second via sites 117.

A methodology is described to locate vias in CE or chip embedded semiconductor packages. The vias can be divided minimum in to a two groups/areas that has a different main function and a different via density. The so-called "loaded" vias carry most of the current and are the vias which most affect the package resistance. The so-called "cold" or "under loaded" vias can be identified and then their amount reduced in accordance with the electric field/current pattern in the package. These vias are mainly used for thermal purposes.

Design options for via arrays covering practical cases have been described and depending on the design the populated via sites of the arrays and the conductive vias are arranged to form either a L, U or O shape. The L- and U-shape configurations are typical for packages employing one-directional current flow whereas O-shape configuration is for multi-directional packages. The design idea enables to reduce costs by decreasing the number of vias or improve the performance without cost increase by keeping the same amount of vias.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a semiconductor device embedded in an insulating layer and having a first contact pad at a first surface of the semiconductor device;
an outer contact pad positioned on a lower surface of the insulating layer; and
a vertical redistribution structure that electrically couples the first contact pad to the outer contact pad,
wherein the first contact pad has a plurality of first via sites,
wherein a first subset of the first via sites is occupied by first vias and a second subset of the first via sites remains unoccupied and forms a first via-free zone, such that the first vias are non-uniformly distributed over the first contact pad.

2. The semiconductor package of claim 1, wherein the vertical redistribution structure comprises a plurality of conductive paths situated at a plurality of second via sites which are positioned adjacent to a side face of the semiconductor device.

3. The semiconductor package of claim 2, wherein an innermost row of the second via sites positioned closest to the side face of the semiconductor device is occupied by second vias.

4. The semiconductor package of claim 3, wherein the second vias extend throughout a thickness of the insulating layer and are lined by a conductive material.

5. The semiconductor package of claim 3, wherein the second via sites occupied by the second vias are arranged in a U-form and surround three sides of the second via-free zone positioned at the side face of the semiconductor device.

6. The semiconductor package of claim 2, wherein a plurality of the second via sites remains unoccupied and forms a second via-free zone.

7. The semiconductor package of claim 6, wherein both the second via sites occupied by the second vias and the second via sites that form the second via-free zone have a substantially stripe form.

8. The semiconductor package of claim 2, wherein outermost ones of the second via sites are occupied by the second vias on three sides of a two-dimensional array to form a general U-shape, wherein a base of the U-shape faces towards the side face of the semiconductor device, and wherein the second via-free zone is surrounded on three sides by the second via sites occupied by the second vias and has an open side facing towards an outermost edge of the semiconductor package.

9. The semiconductor package of claim 2, wherein the second via sites that form an L-shape are occupied by the second vias.

10. The semiconductor package of claim 9, wherein the second vias are positioned around a corner formed between the side face of the semiconductor device and an additional side face of the semiconductor device.

11. The semiconductor package of claim 2, wherein a single row of the second via sites occupied by the second vias is positioned adjacent three sides of the semiconductor device.

12. The semiconductor package of claim 11, wherein the first via sites positioned adjacent three sides of the semiconductor device are occupied by the first vias to form a general U-shape, and wherein a base of the U-shape is arranged substantially parallel to a base of a U-shape formed by the second vias.

13. The semiconductor package of claim 2, wherein the plurality of second via sites are positioned outside of an outer perimeter of the semiconductor device.

14. The semiconductor package of claim 1, wherein the first via sites positioned on three sides of the semiconductor device are occupied by the first vias to form a general U-shape, and wherein the first via-free zone extends to a fourth side of the semiconductor device.

15. The semiconductor package of claim 1, wherein both the first subset of the first via sites and the second subset of the first via sites have a substantially stripe form.

16. The semiconductor package of claim 1, wherein an outermost row of the first via sites adjacent four sides of the semiconductor device are occupied by the first vias such that the first subset of the first via sites forms a ring, and wherein the first via-free zone is positioned substantially in a centre of the first contact pad and encircled by the ring.

17. The semiconductor package of claim 1, wherein the first via sites adjacent four sides of the semiconductor device are occupied with the first vias such that the first vias surround the first via free zone.

18. The semiconductor package of claim 1, wherein the semiconductor device is a semiconductor die.

19. The semiconductor package of claim 1, wherein at least part of the lower surface of the insulating layer forms part of an outer surface of the semiconductor package.

20. A method for fabricating a semiconductor package, the method comprising:
   embedding a semiconductor device in an insulating layer, the semiconductor device having a first contact pad at a first surface of the semiconductor device, the first contact pad having a plurality of first via sites;
   positioning an outer contact pad on a lower surface of the insulating layer;
   occupying a first subset of the first via sites by first vias such that a second subset of the first via sites remains unoccupied and forms a first via-free zone, the first vias being non-uniformly distributed over the first contact pad; and
   forming a vertical redistribution structure that electrically couples the first contact pad to the outer contact pad.

21. The method of claim 20, wherein both the first subset of the first via sites and the second subset of the first via sites have a substantially stripe form.

22. The method of claim 17, wherein an outermost row of the first via sites adjacent four sides of the semiconductor device are occupied by the first vias such that the first subset of the first via sites forms a ring, and wherein the first via-free zone is positioned substantially in a centre of the first contact pad and encircled by the ring.

23. The method of claim 20, wherein the first via sites adjacent four sides of the semiconductor device are occupied with the first vias such that the first vias surround the first via free zone.

* * * * *

UNITED STATES PATENT AND TRADEMARK OFFICE
CERTIFICATE OF CORRECTION

PATENT NO. : 12,159,829 B2
APPLICATION NO. : 17/877177
DATED : December 3, 2024
INVENTOR(S) : S. Yuferev et al.

It is certified that error appears in the above-identified patent and that said Letters Patent is hereby corrected as shown below:

In the Claims

Column 16, Line 44 (Claim 22, Line 1), please change "claim 17" to -- claim 20 --.

Signed and Sealed this
Twenty-eighth Day of January, 2025

Coke Morgan Stewart
*Acting Director of the United States Patent and Trademark Office*